(12) United States Patent
Hazaki et al.

(10) Patent No.: US 6,403,968 B1
(45) Date of Patent: Jun. 11, 2002

(54) SCANNING ELECTRON MICROSCOPE

(75) Inventors: Eiichi Hazaki; Masaki Kurihara, both of Tsuchiura; Kaname Takahashi, Hitachinaka, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/347,844

(22) Filed: Jul. 2, 1999

(30) Foreign Application Priority Data

Jul. 6, 1998 (JP) .......................................... 10-190775

(51) Int. Cl.[7] ................................................. H01J 37/20
(52) U.S. Cl. ................................................. 250/442.11
(58) Field of Search ............ 250/442.11, 440.11–443.1, 250/310

(56) References Cited

U.S. PATENT DOCUMENTS

| | | | | |
|---|---|---|---|---|
| 4,425,507 A | * | 1/1984 | Panov et al. | 250/442.1 |
| 4,587,431 A | * | 5/1986 | Uemura | 250/442.1 |
| 4,627,009 A | * | 12/1986 | Holmes et al. | 364/559 |
| 5,286,977 A | * | 2/1994 | Yokoyama et al. | 250/442.11 |
| 5,455,420 A | * | 10/1995 | Ho et al. | 250/306 |
| 5,510,615 A | * | 4/1996 | Ho et al. | 250/306 |
| 5,811,821 A | * | 9/1998 | Alexander et al. | 250/440.11 |

FOREIGN PATENT DOCUMENTS

JP  2-45497  9/1988

* cited by examiner

Primary Examiner—Kiet T. Nguyen
(74) Attorney, Agent, or Firm—Kenyon & Kenyon

(57) ABSTRACT

Oil from an oil source is introduced into an inside of a reciprocal oil hydraulic pressure cylinder through a port, and a lock shaft is pushed against a lock plate by the oil pressure to restrict movement of a tilt table. A cylindrical portion made of a material having a large friction coefficient to the lock plate is attached to a top end of the lock shaft so as to contact with the lock plate in a surface contact state. Releasing of stage locking is performed by introducing the oil into the inside of the reciprocal oil hydraulic pressure cylinder through another port to draw back the lock shaft by the oil pressure. Thereby, the stiffness of the sample stage lock mechanism in the x-direction becomes large and the friction force in the y- and z-directions also becomes large. Therefore, vibration of the tilt table in the x-, y- and z-directions can be effectively suppressed.

11 Claims, 12 Drawing Sheets

SCANNING ELECTRON MICROSCOPE

BACKGROUND OF THE INVENTION

The present invention relates to a scanning electron microscope and, more particularly, to a scanning electron microscope having vibration resistance.

In a scanning electron microscope, a sample is scanned with an electron beam to generate a signal characteristic of the sample such as a secondary electron signal or a reflected electron signal from the sample. The generated signal is detected, and the detected signal is transmitted to a display as a brightness modulation signal. A screen of the display is scanned in synchronism with the scanning of the sample, and accordingly an image of the sample is displayed on the screen.

The scanning electron microscope has a sample movement device. Thereby, the sample can be moved in arbitrary directions on a plane perpendicular to the axis of the electron beam in the sample chamber, and can be also moved in an axial direction of the electron beam. Further, the sample can be rotated around the axis of the electron beam, and can be also tilted with respect to the axis of the electron beam.

When floor vibration or vibtation caused by sound is transmitted to the sample in the scanning electron microscope, the image is disturbed to decrease its resolution. Therefore, preventive measures against vibration have been usually taken, as described later. However, the measures are not always sufficient.

SUMMARY OF THE INVENTION

An object of the present invention is to provide a scanning electron microscope which can separate the sample from vibration and accordingly improve its resolution.

According to the present invention, a scanning electron microscope is provided which comprises a sample movement device for moving a sample, the sample movement device including a first table for moving the sample in a first direction, a second table for moving the sample in a second direction perpendicular to the first direction, a tilting table for supporting the first and second tables so as to afford tilting operation to the sample; an electron gun generating an electron beam, an axis of the electron beam being perpendicular to the first and second directions; a means for scanning the sample with the electron beam to generate a signal characteristic of the sample and detecting the generated signal; and a lock mechanism for locking the tilting table in a direction of the axis of the electron beam and in the first and second directions in a vibration-proof manner.

Other objects and features of the present invention will be become apparent from the descriptions of preferred embodiments of the present invention taken in connection with the accompanying drawings.

DESCRIPTION OF THE PREFERRED EMBODIMENTS

Figure 1:
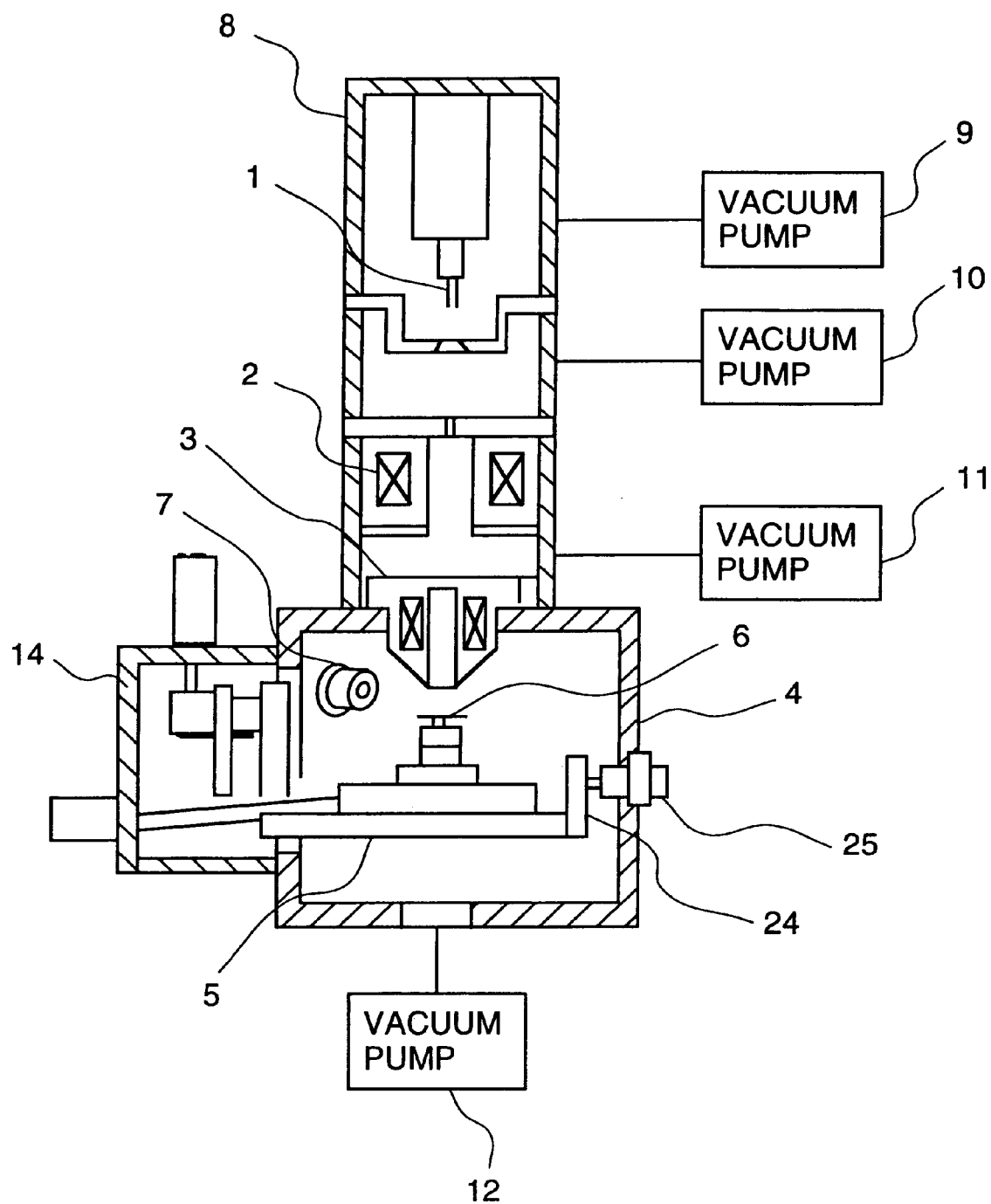
FIG. 1 is an elevational side view in section showing an example of a conventional scanning electron microscope.
Figure 2:
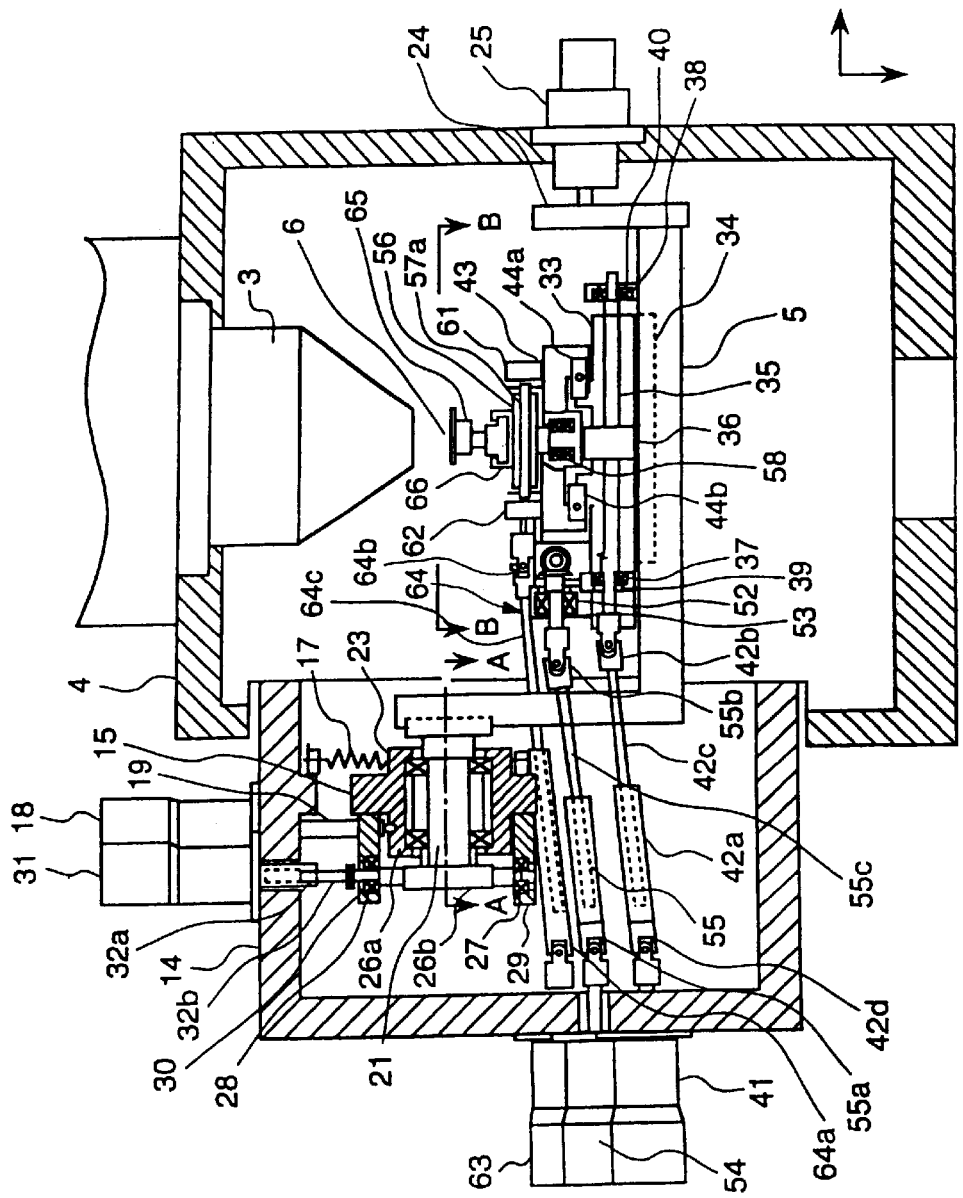
FIG. 2 is an elevational view in section showing an example of a sample movement device in a conventional scanning electron microscope.
Figure 3:
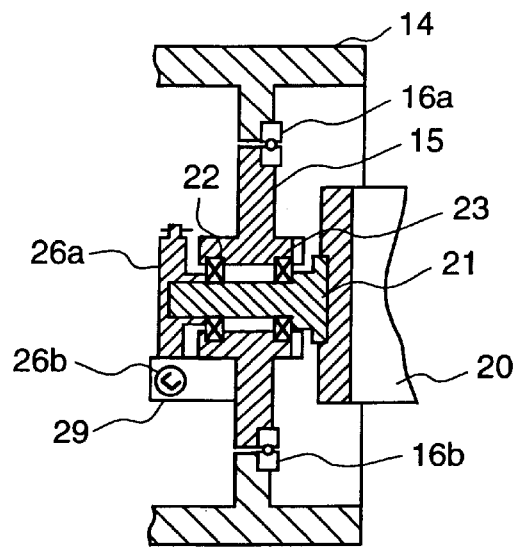
FIG. 3 is a view taken along the line A—A of FIG. 2.
Figure 4:
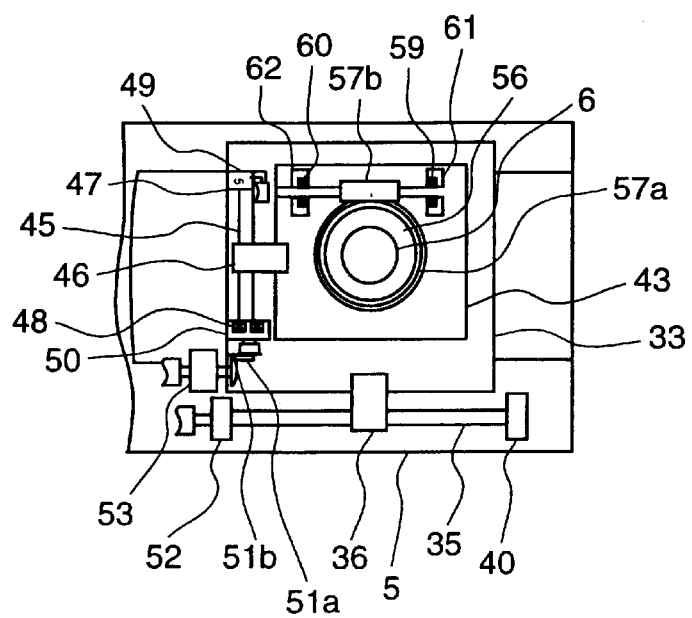
FIG. 4 is a view taken along the line B—B of FIG. 2.

In prior to describing embodiments of the present invention, a conventional scanning electron microscope (SEM) will be initially described below, referring to FIG. 1 to FIG. 9.

An electron beam generated by an electron gun 1 passes through a condenser lens 2 and an objective lens 3, and irradiates a sample 6 mounted on a sample movement stage 6 arranged in a sample chamber 4. The sample 6 is scanned with the electron beam, whereby secondary electrons, reflected electrons and so on are generated from the sample 6. Therefore, for example, a signal of the secondary electrons among them is detected by a secondary electron detector 7, and the detected signal is input to an image display apparatus as a brightness signal. A display screen of the image display apparatus is scanned in synchronism with the scanning on the sample, and accordingly an image of the sample surface is displayed on the display screen.

A sample movement device which a conventional scanning electron microscope has will be described below. In the description, it is assumed that an x-direction and a y-direction indicate directions perpendicular to each other, and a z-direction is a direction normal to the x-y plane, that is, a direction perpendicular to both of the x-direction and the y-direction, and further the z-direction indicates an axial direction of the electron beam irradiating the sample.

The numeral 9 to 12 designate vacuum pumps for evacuating the sample chamber 4, an electron gun chamber 8 and so on. A stage case 14 is attached to the sample chamber 4, and a z table 15 is linked to the stage case 14 through cross roller bearings 16a, 16b. The z table 15 is pulled upward by a spring 17, and is moved in the z-direction guided by the cross roller bearings 16a, 16b by rotating a knob 18 to vertically move a z-movement shaft 19. The vertical movement of the z-movement shaft 19 is performed by the action of a screw provided in the knob 18.

A tilting shaft 21 is attached to one end of a tilting table 20, and the tilting shaft 21 is rotatably linked to the z table 15 through ball bearings 22, 23. A lock plate 24 is attached to the other end of the tilting table 20, and is pushed by a stage lock mechanism 25 attached to the sample chamber 4. A worm wheel 26a is attached to the tilting shaft 21, and a worm gear 26b engaging with the worm wheel 26a is supported by ball bearings 27, 28 and attached to the z table 15 with bearing housings 29, 30. The worm wheel 26a and a knob 31 for rotating the worm gear 26b are linked by spline shafts 32a, 32b so that they can follow the z-direction movement of the z table 15. The tilting shaft 21 is rotated by rotating the knob 31 to tilt the sample 6 and holding the tilting angle constant.

An x table 33 for moving the sample 5 in the x-direction is attached to the tilting table 20 through a cross roller bearing 34. The x table 33 is driven by the action of an x ball screw 35 and an x ball screw nut 36. The x ball screw nut 36 is fixed to the x table 33. The x ball screw 35 is supported by ball bearings 37, 38 at the both ends and attached to the tilting table 20 with bearing housings 39, 40. The x ball screw 35 and a DC motor 41 for rotating the x ball screw 35 are linked with an x stage joint 42. The x stage joint 42 is composed of a pair of joint portions 42a, 42b for following in change of angle and an expandable portion 42c for adjusting length which is formed by inserting a polygonal rod into a polygonal pipe. The x ball screw 35 is rotated by driving the DC motor 41 through the x stage joint 42 to move the x ball screw nut 36 in the x-direction, and thereby the x table 33 is moved in the x-direction to move the sample in the x-direction.

A y table 43 is attached to the x table 33 through cross roller bearings 44a, 44b. The y table 43 is driven by moving action of a y ball screw 45 and a y ball screw nut 46. The y ball screw nut 46 is fixed to the y table 43. The y ball screw 45 is supported at the both ends by ball bearings 47, 48 and attached to the x table 33 with bearing housings 49, 50. A bevel gear 51a is attached to one end of the y ball screw 45, and a bevel gear 51b engaging with the bevel gear 51a is supported by a ball bearing 52 and fixed to the x table with a bearing housing 53. A DC motor rotating the bevel gear 51b and the y ball screw 45 is linked with a y stage joint 55. The y stage joint 55 is composed of a pair of joint portions 55a, 55b for following in change of angle and an expandable portion 55c for adjusting length which is formed by inserting a polygonal rod into a polygonal pipe. The bevel gears 51a, 51b and the y ball screw 45 are rotated by driving the DC motor 54 through the y stage joint 55 to move the y ball screw nut 46 in the x-direction, and thereby the y table 43 is moved in the y-direction to move the sample in the y-direction.

A worm wheel 57a is attached to a rotation table 56, and the rotation table 56 is rotatably joined to the y table 43 through a ball bearing 58. A worm gear 57b is supported at the both ends with ball bearings 59, 60 and attached to the y table 43 with bearing housings 61, 62. The worm gear 57b and a knob 63 for rotating the worm gear 57b are linked with an R stage joint 64. The R stage joint 64 is composed of a pair of joint portions 64a, 64b for following in change of angle and an expandable portion 64c for adjusting length which is formed by inserting a polygonal rod into a polygonal pipe. The worm gear 57b and the worm wheel 57a are rotated by rotating the knob 63 through the R stage joint 64, and thereby the rotation table 56 is rotated to rotate the sample. The sample 6 is bonded to a sample holder 65, and the sample holder 65 is inserted and fixed to a holder table 66 mounted on the rotation table 56.

Figure 5:
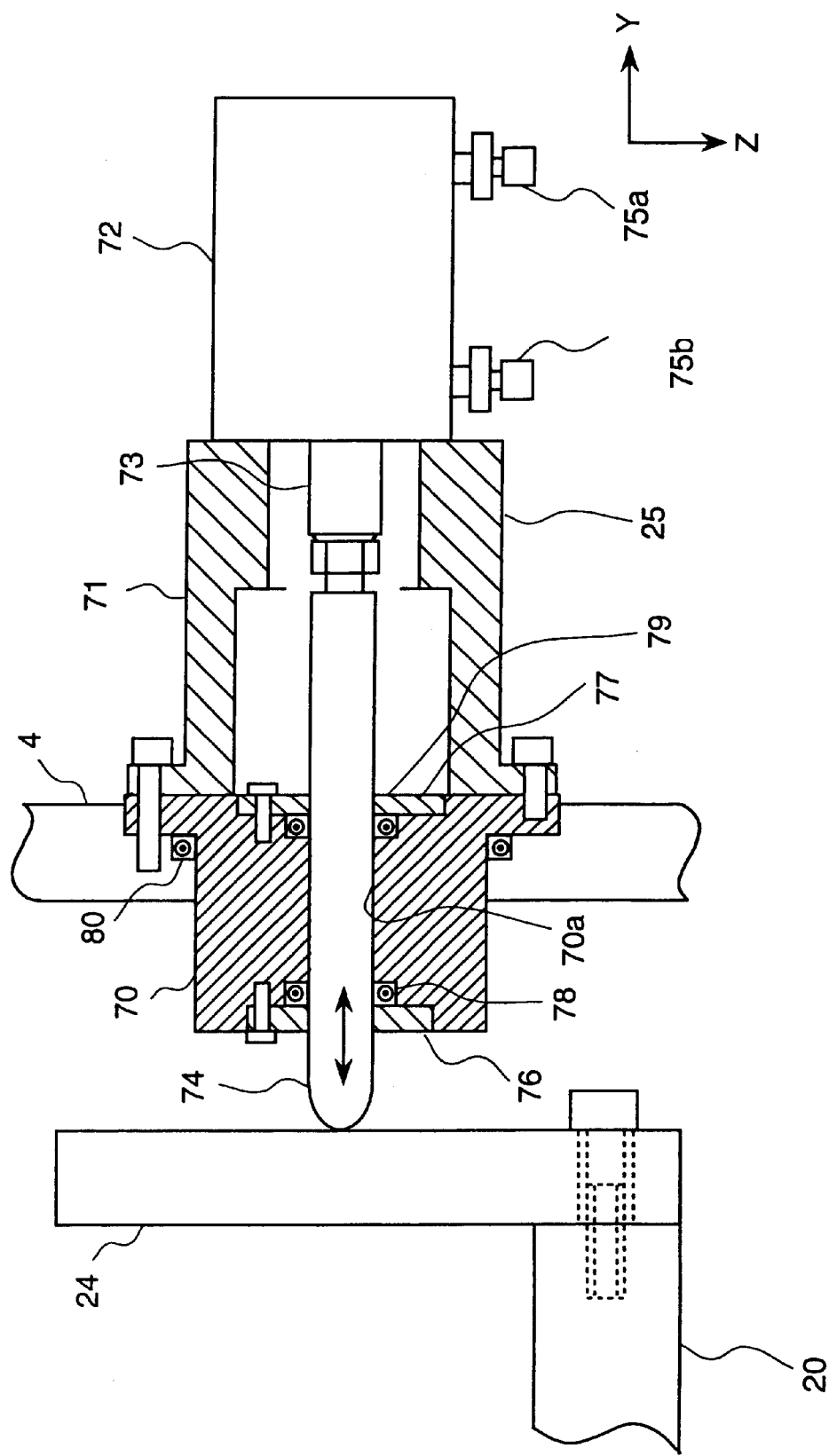
FIG. 5 is an elevational view in section showing a sample stage lock mechanism in a conventional scanning electron microscope.

The reference character 25 indicates a stage lock mechanism, and operation of the lock mechanism will be described below, referring to FIG. 5. A lock bearing 70 is fixed to the sample chamber 4, and a lock flange 71 is attached to the lock bearing 70, and a reciprocal pneumatic cylinder 72 is attached to the lock flange 71. A lock shaft 74 is joined to an output shaft 73 of the reciprocal pneumatic cylinder 72, and the lock shaft 74 is pushed to a lock plate 24 to restrict movement of the stage 5 by introducing compressed air into the inside of the reciprocal pneumatic cylinder 72 through a port 75a. When the stage 5 is brought into a lock state in such a manner, vibration in the stage 5 is reduced and accordingly observation having a small image fault caused by vibration can be performed during SEM image observation. This method is suitable for observation high in resolution and high in magnification. Releasing of the stage lock is performed by introducing compressed air into the inside of the reciprocal pneumatic cylinder 72 through a port 75b to draw back the lock shaft 74. By releasing the stage lock, the stage 5 can be tilted and moved in the z-direction.

A gap between guide plates 76, 77 and the lock shaft 74 is set to a value smaller than a gap between the lock shaft 74 and a hole portion 70a of the lock bearing 70, and the guide plates 76, 77 guide the reciprocal movement of the lock shaft 74 and restrict movement of the lock shaft in the z-direction. O-rings 78, 79, 80 isolate the vacuum inside the sample chamber 4 from atmosphere.

Figure 6:
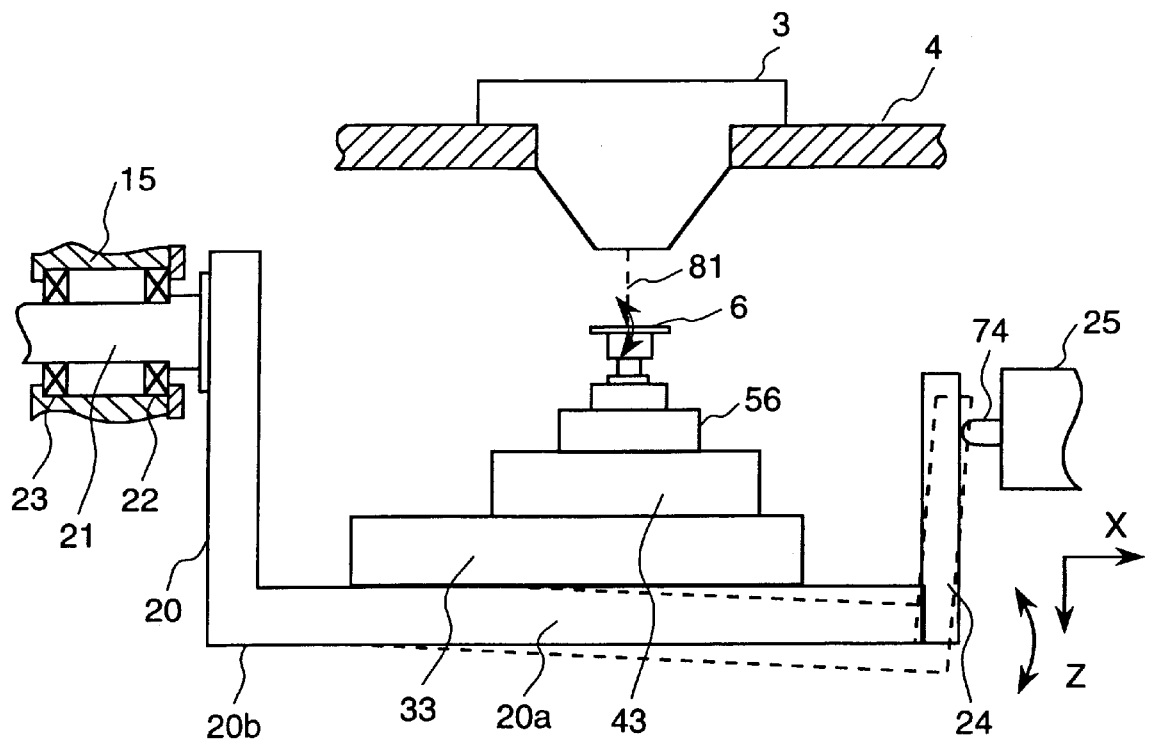
FIG. 6 is a view for explaining a relationship among vibration in a tilting table, a sample and an electron beam in a conventional scanning electron microscope.

In the conventional scanning electron microscope, it is not considered to positively suppress the vibration of the sample movement stage 5 caused by floor vibration or sound. This matter will be described below, referring to FIG. 6 to FIG. 9. When vibration caused by floor vibration or sound is transmitted to the stage 5 through the sample chamber 4, bending vibration in the z-direction with respect to a base portion 20b is apt to be caused in a base portion 20a of the tilt table 20 because the tilt table 20 mounts the x table 33, the y table 43 and the rotation table 56 and in addition to this the base portion 20a is long in the x-direction. When such vibration is caused, an x-direction component of displacement is produced in the sample 6 because the base portion 20a of the tilt table 20 is displaced in an arc shape as shown in FIG. 6. As a result, relative displacement in the x-direction is caused between the electron beam 81 and the sample 6 to cause an image fault in the SEM image.

When the base portion 20a of the tilt table 20 is vibrated in the z-direction, the tilt table 20 is displaced as shown by dashed lines, and accordingly the lock plate 24 is also displaced as shown by the dashed lines, that is, both in the z-direction and in the x-direction. By pushing the lock shaft 74 to the lock plate 24 at that time, a friction force is caused at a contact portion between the lock shaft 74 and the lock plate 24 so as to restrict the displacement of the lock plate 24 in the z-direction by the friction force. However, since the reciprocal pneumatic cylinder 72 is operated with an air pressure of approximately 0.5 MPa, an appropriate pushing force of the lock shaft 74 against the lock plate 24 can not be obtained and consequently the friction force is not sufficient to restrict the displacement in the z-direction. In addition, the stiffness of the sample stage lock mechanism in the x-direction is week because the compressive air is introduced into the inside of the reciprocal pneumatic cylinder 72, and accordingly the lock shaft 74 is easily displaced in the x-direction. Therefore, the lock shaft 74 is difficult to restrict the displacement of the lock plate 24 in the x-direction. As a result, a relative displacement in the x-direction remains between the electron beam 81 and the sample 6, and consequently an image fault is produced in the SEM image.

Figure 7:
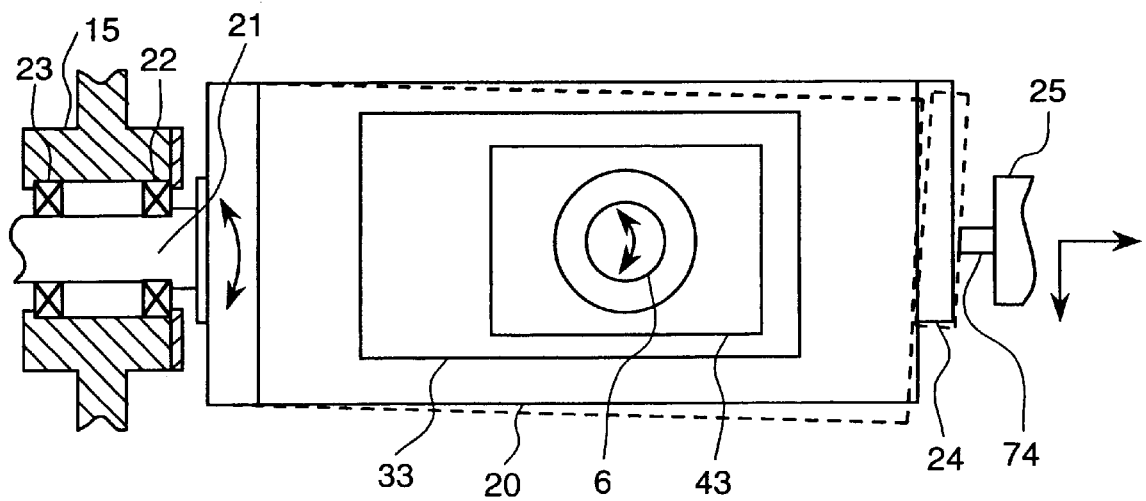
FIG. 7 is a view of FIG. 6 seeing from the upper side.

In addition, vibration of the tilt table 20 in the y-direction with respect to the tilt shaft 21 or the ball bearings 22, 23 is caused by floor vibration or sound, as shown in FIG. 7. By this vibration, a displacement both in the x-direction and in the y-direction is produced in the sample 6 because the base portion 20a of the tilt table 20 is displaced in an arc shape as shown in FIG. 7. As a result, a relative displacement both in the x-direction and in the y-direction is caused between the electron beam 81 and the sample 6 to cause an image fault in the SEM image. When the tilt table 20 is vibrated in the y-direction with respect to the tilt shaft 21 or the ball bearings 22, 23, the tilt table 20 is displaced as shown by the dashed lines and accordingly the lock plate 24 is also displaced as shown by the dashed lines, that is, both in the y-direction and in the x-direction. In this case, similar to the above-mentioned case of the z-direction vibration of the base portion 20a of the tilt table 20, a friction force between the lock shaft 74 and the lock, plate 24 large enough to restrict the displacement of the lock plate 24 in the z-direction, and accordingly the lock shaft 74 is difficult to restrict the displacement of the lock plate 24 in the x-direction. As a result, a relative displacement in the x-and y-directions remains between the electron beam 81 and the sample 6, and consequently an image fault is produced in the SEM image.

Figure 8:
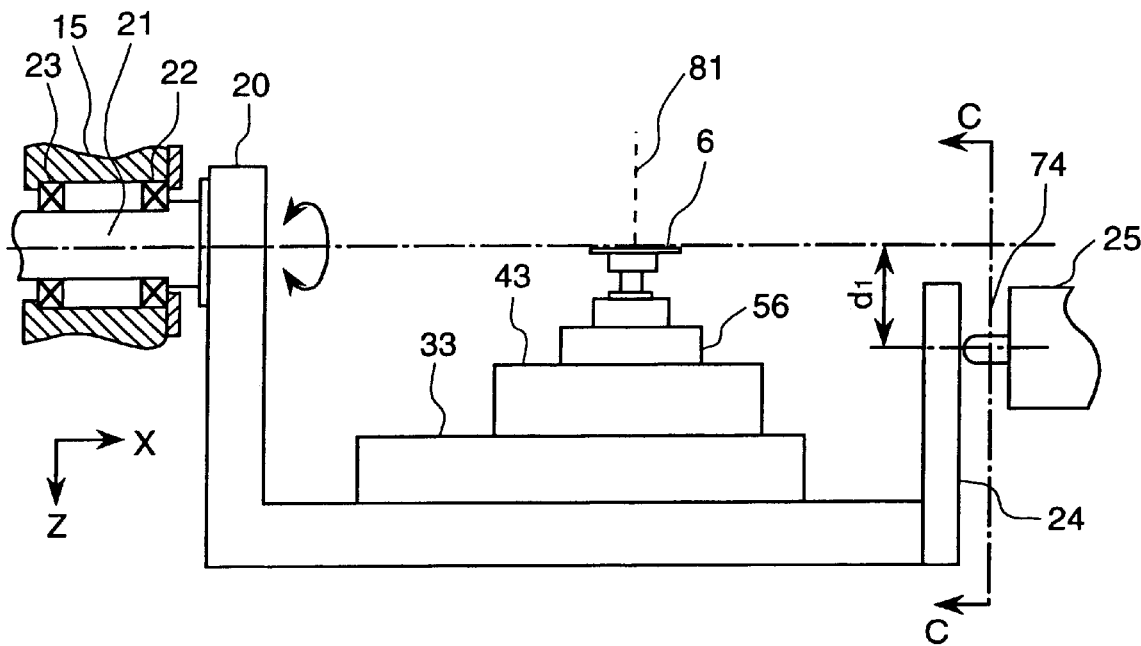
FIG. 8 is a view for explaining another relationship among vibration in a tilting table, a sample and an electron beam in a conventional scanning electron microscope.
Figure 9:
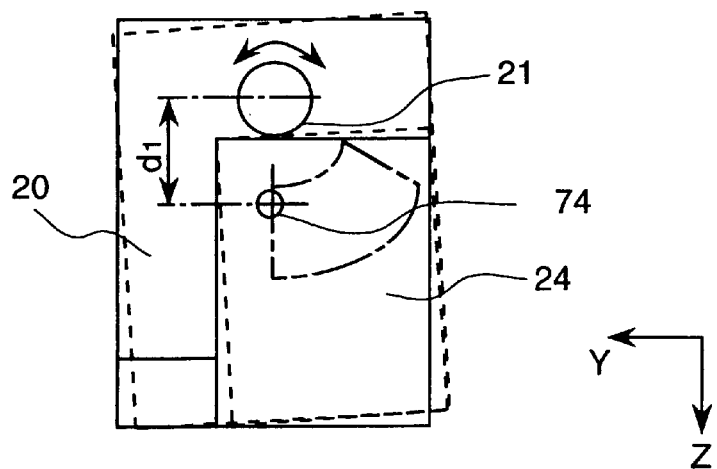
FIG. 9 is a view taken along the line C—C of FIG. 8.

Description will be made below on a case where the tilt table 20 is vibrated in the rotational direction around the tilt shaft 21, referring to FIG. 8 and FIG. 9. FIG. 9 is a view taken along the line C—C of FIG. 8. An area surrounded by a chain line in FIG. 9 is an area on which the lock shaft 74 pushes the lock plate 24 because the lock plate 24 is moved by tilt operation and z-direction movement of the sample movement stage 5. The tilt table 20 is vibrated in the rotating direction around the tilt shaft 21 by twisting vibration of the tilt shaft 21 with respect to a contact portion between the worm wheel 26a and the worm gear 21b as a fixed point and by vibration in the axial direction of the ball bearings 27, 28 supporting the worm gear 26b which are caused by floor vibration or sound vibration. A point on the sample 6 on which the electron beam is irradiated does not agree with an axial center of the tilt shaft 21. Therefore, a y-direction component of displacement is produced in the sample 6 when the tilt table 20 is vibrated in the rotating direction around the tilt shaft 21. As a result, a relative displacement in the y-direction is produced between the electron beam 81 and the sample 6, and consequently an image fault is produced in the SEM image.

When the tilt table 20 is vibrated in the rotating direction around the tilt shaft 21, the tilt table 20 is displaced as shown by dashed lines, and accordingly the lock plate 24 is also displaced as shown by the dashed lines, that is, both in the y-direction and in the z-direction. By pushing the lock shaft 74 to the lock plate 24 at that time, a friction force is caused at a contact portion between the lock shaft 74 and the lock plate 24 so as to restrict the displacement of the lock plate 24 in the rotating direction around the tilt shaft 21 by the friction force. However, since a distance dl between the rotation center of the tilt shaft 21 and the contact portion of the lock shaft 74 and the lock plate 24, it is impossible to obtain inverse rotation torque cause by the friction force large enough to stop the rotation force around the tilt shaft 21 of the tilt table 20 caused by the vibration. As a result, a relative displacement in the y-direction remains between the electron beam 81 and the sample 6, and consequently an image fault is produced in the SEM image. As described above, in the conventional scanning electron microscope, the lock mechanism can not certainly suppress vibration of the tilt table 20 caused by floor vibration or sound. As a result, the relative displacement between the sample 6 and the electron beam 81 remains, and accordingly an image fault is produced to interfere with improving of the resolution of the scanning electron microscope.

According to embodiments of the present invention, the above-mentioned problems can be solved. The embodiments will be described below, referring to FIG. 10 to FIG. 16. However, since the scanning electron microscopes are substantially the same as the above-mentioned conventional scanning electron microscope including the sample movement device except for the stage lock mechanism, the embodiments of the present invention will be described in detail focusing on points different from the above-mentioned conventional scanning electron microscope.

Figure 10:
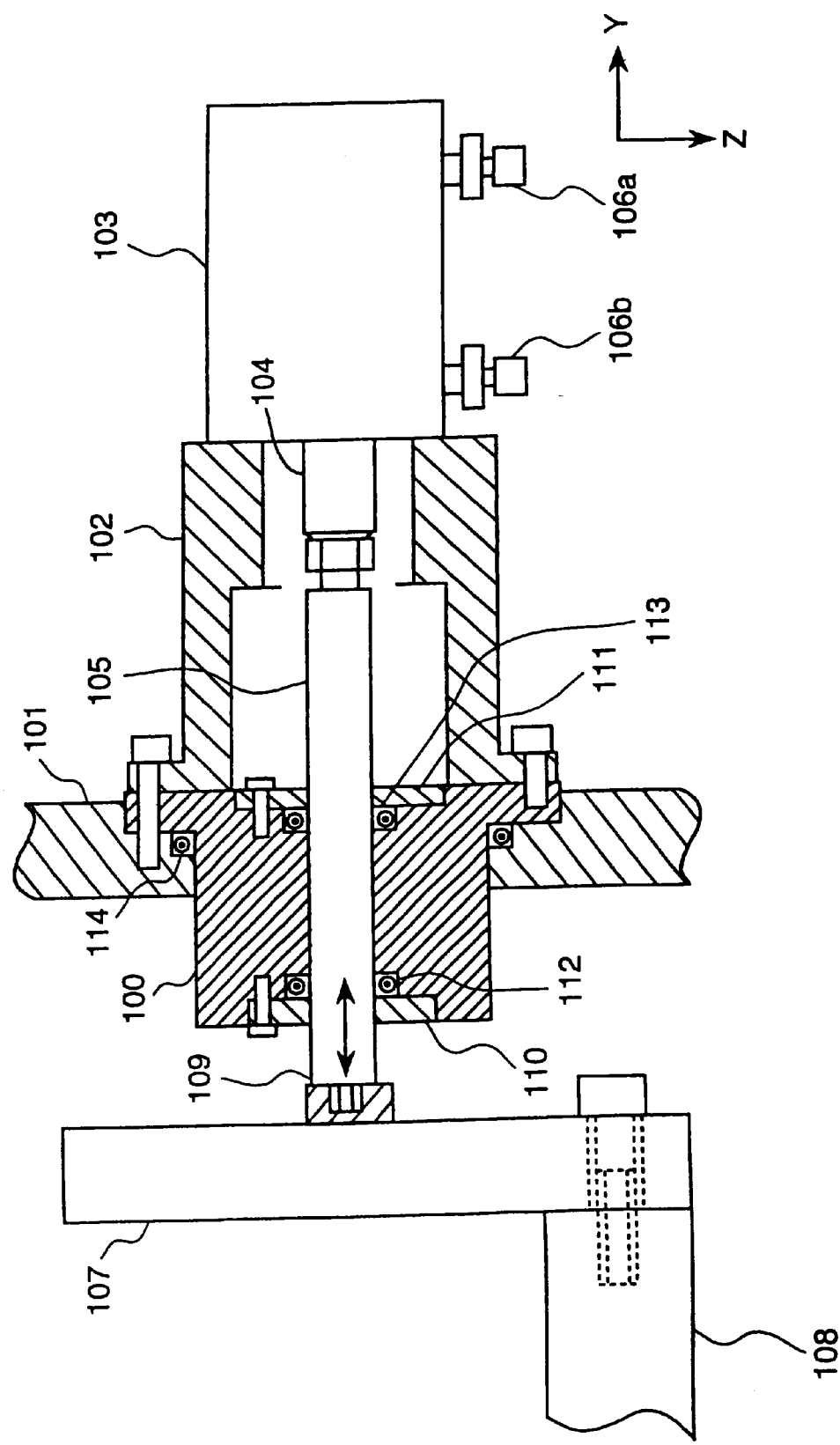
FIG. 10 is an elevational view in section showing a first embodiment of a sample stage lock mechanism in a scanning electron microscope in accordance with the present invention.

FIG. 10 shows a first embodiment of a stage lock mechanism in a scanning electron microscope in accordance with the present invention. A lock bearing 100 is fixed to a sample chamber 101, and a lock flange 102 is attached to the lock bearing 100, and a reciprocal oil hydraulic cylinder 103 is attached to the lock flange 102. A lock shaft 105 is joined to an output shaft 104 of the reciprocal oil hydraulic cylinder 103, and oil from an oil source, not shown, is introduced into the inside of the reciprocal oil hydraulic cylinder 103 through a port 106a, and the lock shaft 105 is pushed to a lock plate 107 by the oil pressure to restrict movement of a tilt table 108. A cylindrical portion 109 made of a material having a friction coefficient to the lock plate 107 larger than that between the lock plate 107 and the lock shaft 105 is attached at the top end of the lock shaft 105 so as to contact with the lock plate 107 in a surface contacting state. Releasing of stage locking is performed by introducing the oil into the inside of the reciprocal oil hydraulic pressure cylinder 103 through a port 106b to draw back the lock shaft 105 by the oil pressure. Guide plates 110, 111 guide the reciprocal movement of the lock shaft 105 and restrict movement of the lock shaft in the y- and z-directions. O-rings 112, 113, 114 isolate the vacuum inside the sample chamber 101 from atmosphere.

According to the present embodiment, since the incompressible oil is introduced into the inside of the reciprocal oil hydraulic cylinder 103, the stiffness of the sample stage lock mechanism in the x-direction becomes large and, therefore, vibration of the tilt table in the x-direction can be effectively suppressed. Further, the cylindrical portion 109 at the top end of the lock shaft 105 is in contact with the lock plate 107 in the surface contacting state and is made of a material having a large friction coefficient. Therefore, the friction force in the y- and z-directions becomes large, and accordingly vibration of the tilt table 108 in the y- and z-directions can be effectively suppressed. As a result, the relative displacement between the electron beam and the sample becomes smaller, and the SEM image fault caused by floor vibration or sound vibration is substantially reduced, and accordingly the resolution of the scanning electron microscope can be improved.

Figure 11:
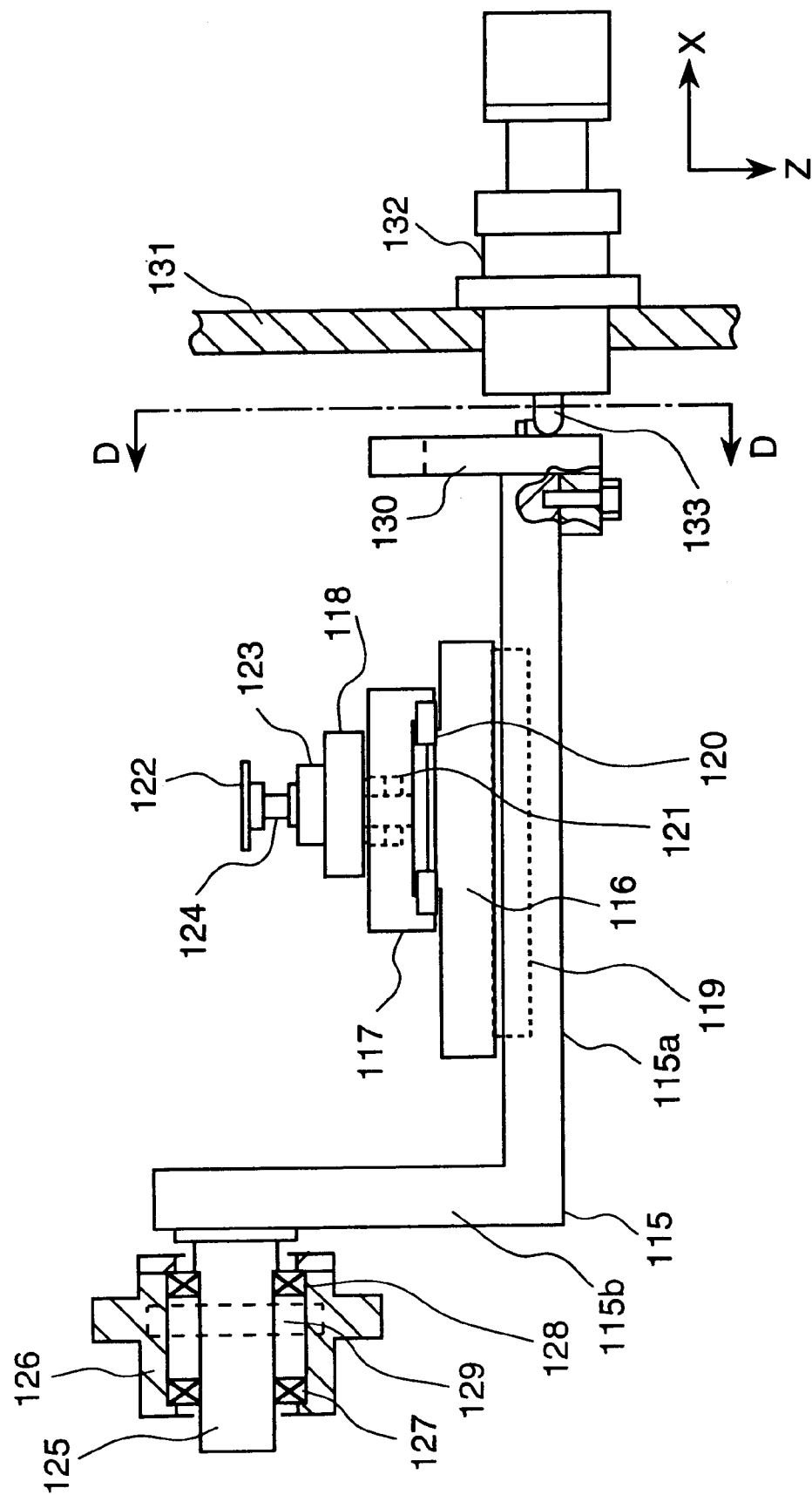
FIG. 11 is a partially cross-sectional front view showing a second embodiment of a sample stage lock mechanism in a scanning electron microscope in accordance with the present invention.
Figure 12:
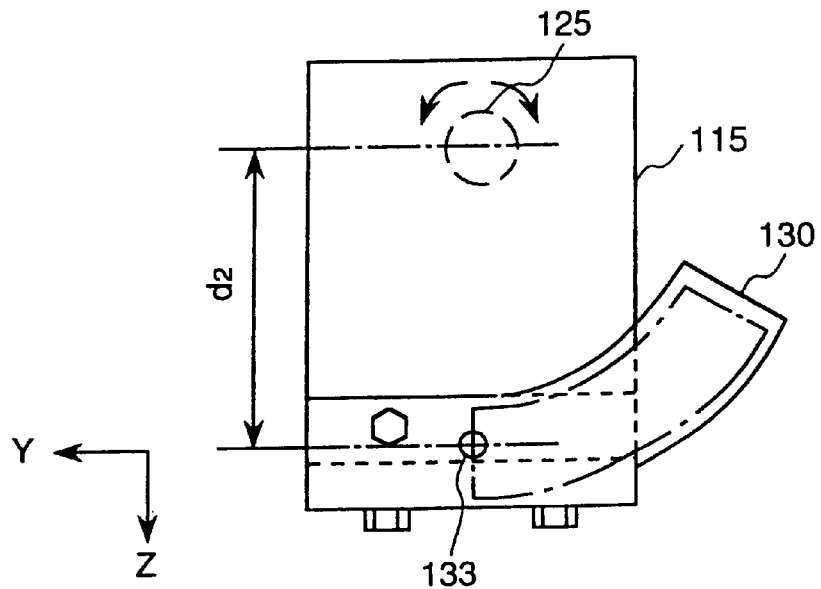
FIG. 12 is a view taken along the line D—D of FIG. 11.

FIG. 11 shows a second embodiment of a stage lock mechanism in a scanning electron microscope in accordance with the present invention. FIG. 12 is a view taken along the line D—D of FIG. 11. An x table 116, a y table 117 and a rotation table 118 are mounted on a tilt table 115. The x table 116 is guided in the x-direction by a cross roller bearing 119, the y table 117 is guided in the y-direction by a cross roller bearing 120, and the rotation table 118 is guided in the rotating direction by a ball bearing 121. A sample 122 is bonded onto a sample holder 124 inserted into a holder table 123 attached to the rotation table 118, and the sample 122 may be moved in the x- and y-directions and also rotated.

The tilt table 115 is supported by two ball bearings 127, 128 set in a z table 126 through a tilt shaft 125, and the sample 122 can be tilted by rotating the tilt table 115 around the tilt shaft 125. The z table 126 is guided by a cross roller bearing 129 in the z-direction to move the sample in the z-direction. The driving system moving in the x-, y- or z-direction or rotating or tilting each of the tables is the same as that in the conventional scanning electron microscope. A lock plate 130 is fixed to an end portion of the tilt table 115, and a lock shaft 133 of the lock mechanism 132 attached to a sample chamber 131 pushes the lock plate 130 to suppress vibration caused by floor vibration or sound. An area on which the lock shaft 133 pushes the lock plate 130 is a portion surrounded by a chain line in FIG. 12. The arc-shaped portion shown by the chain line is formed by tilt operation of the tilt table 115 with respect to the shaft center of the tilt shaft as the rotating center. The straight line portion in the radial direction shown by the chain line is formed by movement of the tilt table in the z-direction. The position of the lock plate 130 is set so that a base portion 115a (the end portion) of the tilt table 115 is included as a part of the area in which the lock shaft 133 pushes the lock plate 130 in order to lengthen the radial distance between the shaft center of the tilt shaft 125 and the point where the lock shaft 133 pushes the lock plate 130.

According to the present embodiment, the distance d2 between the shaft center of the tilt shaft 125 and the point where the lock shaft 133 pushes the lock plate 130 becomes long so that the inverse rotational torque of product of the friction force between the lock shaft 133 and the lock plate 130 and the distance d2 can be made sufficiently large. Therefore, weight of the tilt table 115 can be reduced since thickness of the tilt shaft 125 and the base portion 115b of the tilt table 115 can be made thinner compared to that in FIG. 8. This leads to reducing of bending in the tilt table 115. As a result, the relative displacement between the electron beam and the sample becomes smaller, and the SEM image fault caused by floor vibration or sound vibration is substantially reduced, and accordingly the resolution of the scanning electron microscope can be substantially improved.

Therein, the idea of increasing the distance d2 can be commonly applied to all the embodiments of the present invention.

Figure 13:
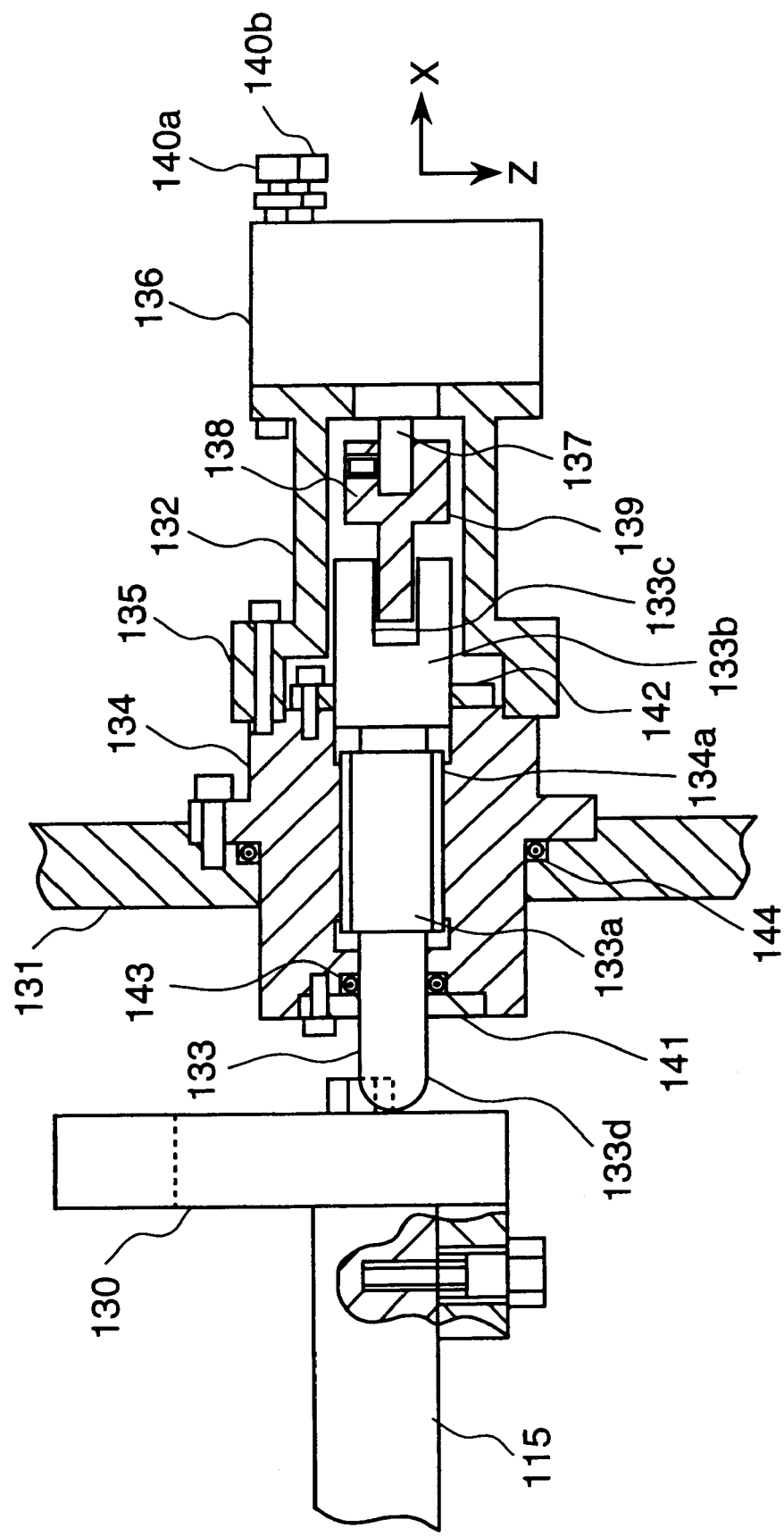
FIG. 13 is a detailed elevational view in section showing the sample stage lock mechanism in the second embodiment in accordance with the present invention shown in FIG. 11.

FIG. 13 shows the stage lock mechanism 132 in the second embodiment shown in FIG. 11 in detail. A lock bearing 134 is fixed to a sample chamber 131, and a lock flange 135 is attached to the lock bearing 134, and a rotary pneumatic actuator 136 is attached to the lock flange 135. A joint 139 is joined to an output shaft 137 of the rotary pneumatic actuator 136 with a fastening screw 138. A screw portion 133a of a lock shaft 133 is engaged with a female screw portion 134a of the lock bearing 134, and a coupling portion 133b having a groove is formed in one side of the screw portion, and the joint 139 fixed to the output shaft 137 of the rotary pneumatic actuator 136 is inserted into the groove portion 133c.

A pushing portion 133d having a semi-spherical end is formed in the other side of the screw portion 133a of the lock shaft 133. The joint 139 transmits rotation torque of the rotary pneumatic actuator 136 to the lock shaft 13 through the groove portion 133c of the coupling portion 133b. The joint 139 is slidable within the groove portion 133c to movement of the lock shaft 133 in the axial direction. By introducing compressed air inside the rotary pneumatic actuator through a port 140a, clockwise rotation is given to the rock shaft 133 through the joint 139, and the screw portion 133a of the lock shaft 133 is moved in the axial direction by the female screw portion 134a of the lock bearing 134 to restrict movement of the tilt table 115 by pushing the end of the pushing portion 133d of the lock shaft 133 to the lock plate 130. Releasing of stage locking is performed by introducing compressed air inside the rotary pneumatic actuator 136 through a port 140b to rotate the lock shaft 133 counterclockwise to be drawn back. The pushing portion 133d and the coupling potion 133b of the lock shaft 133 are guided by guide plates 141, 142 respectively to transmit rotational and reciprocal movement of the lock shaft and restrict movement in the y- and z-directions. O-rings 143, 144 isolate vacuum inside the sample chamber 131 from atmosphere.

The rotary pneumatic actuator 136 used for the lock mechanism of the present embodiment has a size nearly equal to that of a reciprocal pneumatic cylinder commonly used in a lock mechanism. Even if rotation torque is generated by an air pressure nearly equal to that of a reciprocal pneumatic cylinder commonly used in a lock mechanism, the end of the lock shaft 133 can push the lock plate 130 with a large force by the action of the screw portion 133a of the lock shaft 133 and the female screw portion 134a of the lock bearing 134. Therefore, the friction force between the lock shaft 133 and the lock plate 130 in the y- and z-directions becomes large, and accordingly vibration of the tilt table 115 in the y- and z-directions can be effectively suppressed. Further, the lock mechanism has a large stiffness in the x-direction because the lock shaft 133 receives the x-direction force acting on the screw portion 133a by the female screw portion 134 of the lock bearing 134, and accordingly vibration of the tilt table 115 in the x-direction can be effectively suppressed. As a result, the relative displacement between the electron beam and the sample becomes smaller, and the SEM image fault caused by floor vibration or sound vibration is substantially reduced, and accordingly the resolution of the scanning electron microscope can be substantially improved.

Although the rotary pneumatic actuator 136 is employed in order to give the rotation movement to the lock shaft 133 in FIG. 13, the same function may be obtained by employing a DC motor with a reduction gear which is small in size and capable of outputting high torque.

Figure 15:
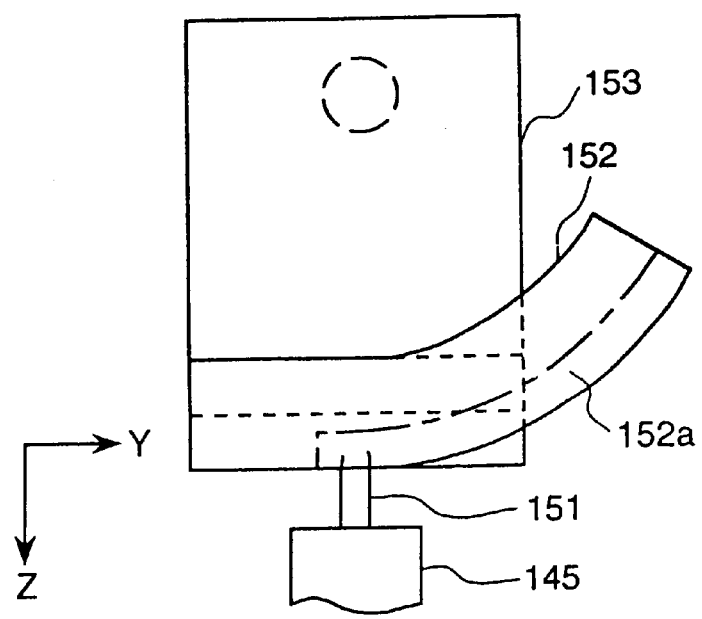
FIG. 15 is a view taken along the line E—E of FIG. 14.
Figure 14:
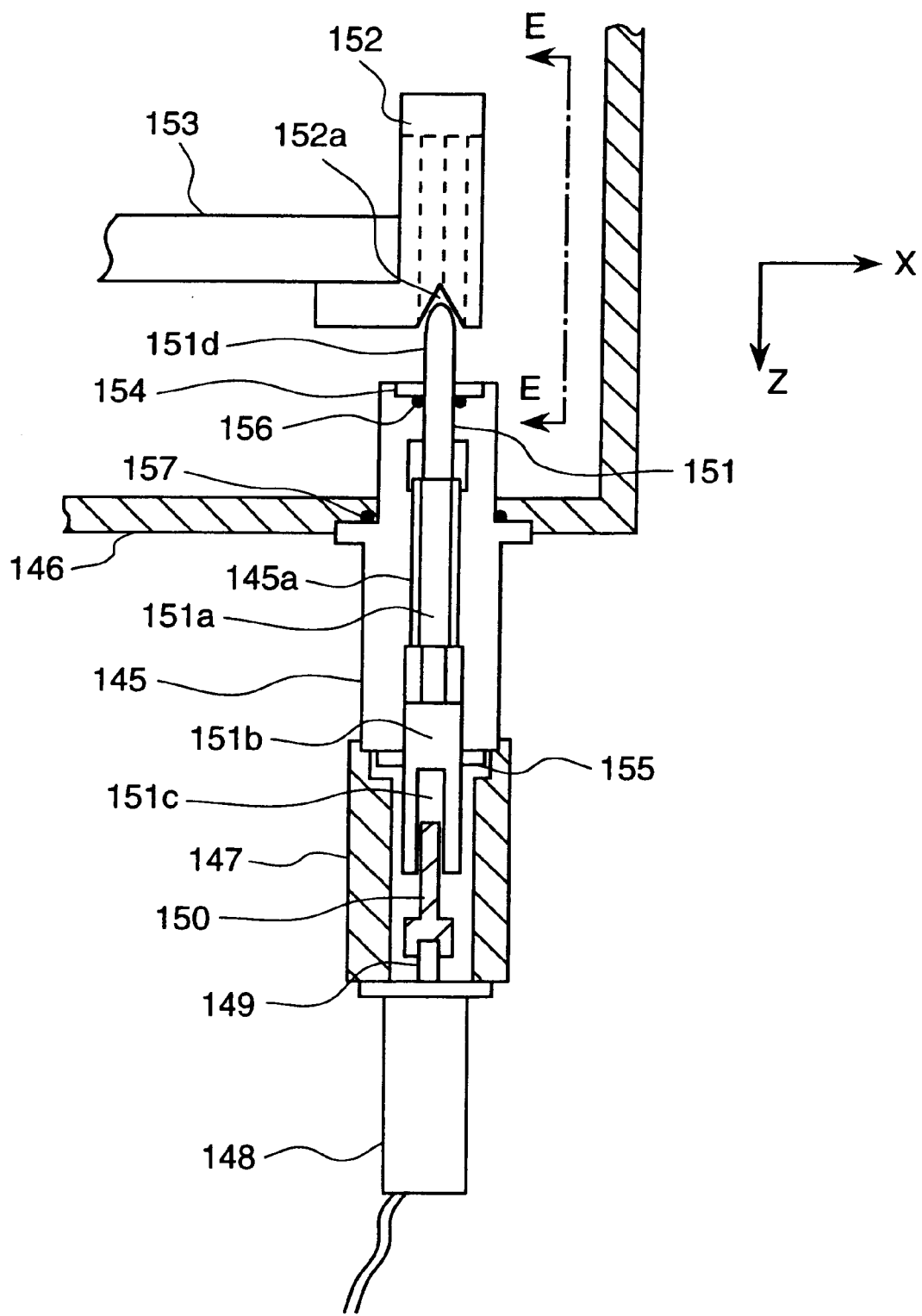
FIG. 14 is an elevational view in section showing a third embodiment of a sample stage lock mechanism in a scanning electron microscope in accordance with the present invention.

FIG. 14 shows a third embodiment of a stage lock mechanism in a scanning electron microscope in accordance with the present invention. FIG. 15 is a view taken along the line E—E of FIG. 14.

A lock bearing 145 is fixed to a bottom portion of a sample chamber 146, and a lock flange 147 is attached to the lock bearing 145, and a DC motor 148 having a reduction gear is attached to the lock flange 147. A joint 150 is joined to an output shaft 149 of the DC motor 148 having a reduction gear. A screw portion 151 a of a lock shaft 151 is engaged with a female screw portion 145a of the lock bearing 145, and a coupling portion 151b having a groove is formed in one side of the screw portion, and the joint 150 fixed to the output shaft 149 of the DC motor 148 having the reduction gear is inserted into the groove portion 151c. A pushing portion 151d having a semi-spherical end is formed in the other side of the screw portion 151a of the lock shaft 151. The joint 150 transmits rotation torque of the DC motor 148 having the reduction gear to the lock shaft 151 through the groove portion 151c of the coupling portion 151b. The joint 150 is slidable within the groove portion 151c to movement of the lock shaft 151 in the axial direction.

By applying voltage to the DC motor having the reduction gear to give clockwise rotation to the rock shaft 151 through the joint 150, the screw portion 151a of the lock shaft 151 is moved in the axial direction by the female screw portion 145a of the lock bearing 145 to restrict movement of the tilt table 153 by pushing a V-shaped groove 152a provided on the lock plate 152 with the end of the pushing portion 151d of the lock shaft 151. Releasing of stage locking is performed by rotating the DC motor 148 having the reduction gear toward an inverse direction to rotate the lock shaft 151 toward the inverse direction to be drawn back. The reason why the DC motor 148 having the reduction gear is used is that the lock shaft 151 can be moved in a long stroke corresponding to the movement of the tilt table 153 in the z-direction, that is, corresponding to the movement of the lock plate 152 in the z-direction. The pushing portion 151d and the coupling portion 151b of the lock shaft 151 are guided by guide plates 154, 155 respectively to transmit rotational and reciprocal movement of the lock shaft and restrict movement in the y- and z-directions. O-rings 156, 157 isolate vacuum inside the sample chamber 131 from atmosphere.

According to the present embodiment, vibration of the tilt table 153 in the x-direction can be effectively suppressed since the lock shaft 151 is pushed into the V-shaped groove 152a of the lock plate 152. Further, the stage lock mechanism has large stiffness in the z-direction and accordingly vibration of the tilt table 153 in the z-direction can be effectively suppressed since a z-direction force acting on the screw portion 151a of the lock shaft 151 can be received by the female screw portion 145a of the lock bearing 145. Furthermore, vibration of the tilt table 153 in the y-direction can be effectively suppressed by friction forces at two points between the V-shaped groove 152a of the lock plate 152 and the end of the pushing portion 151d of the lock shaft 151. As a result, the relative displacement between the electron beam and the sample becomes smaller, and the SEM image fault caused by floor vibration or sound vibration is substantially reduced, and accordingly the resolution of the scanning electron microscope can be substantially improved. The present embodiment is suitable for a scanning electron microscope used in an environment where vibration of floor or vibration of sound is large.

Figure 16:
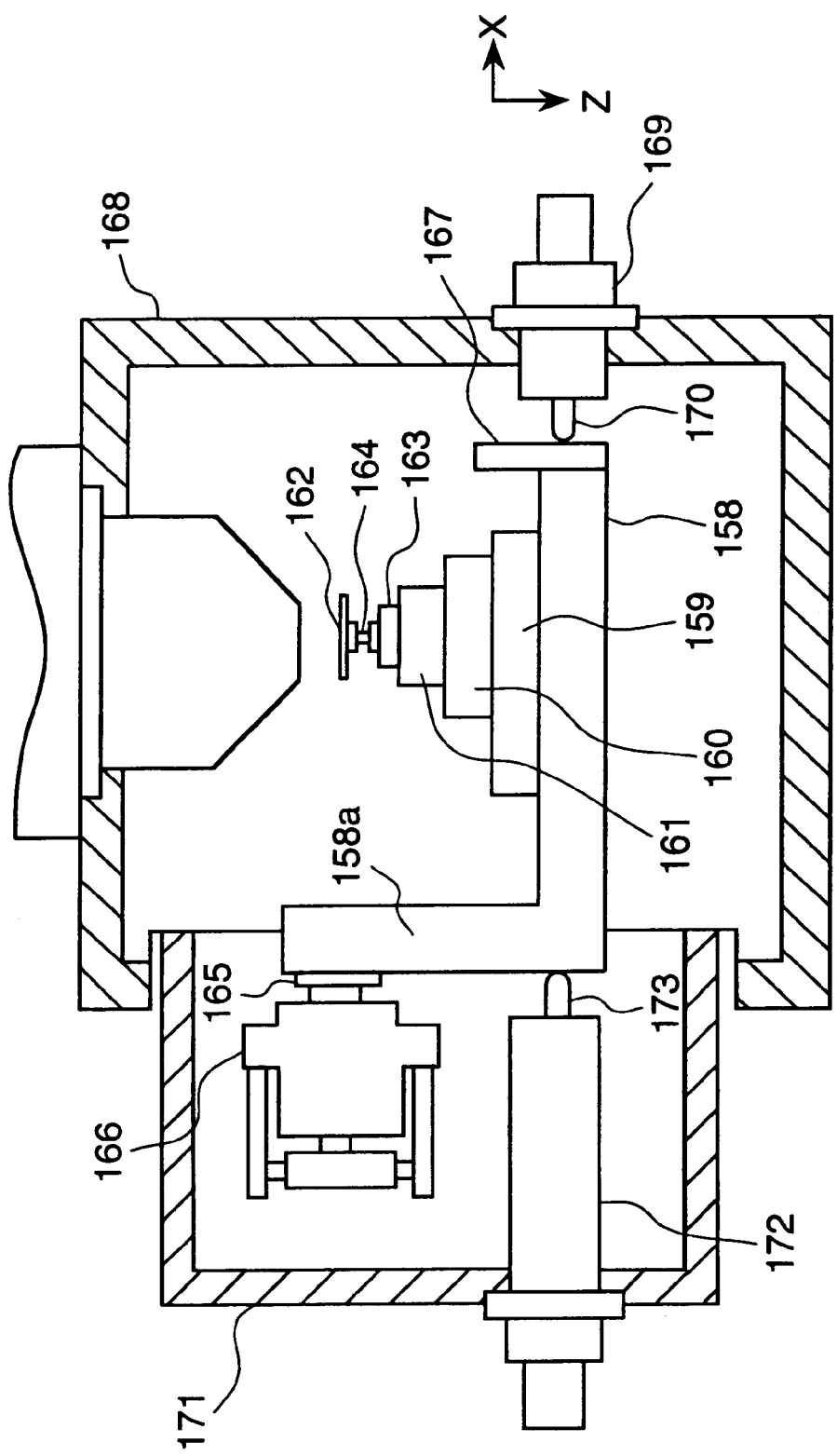
FIG. 16 is a partially cross-sectional front view showing a second embodiment of a sample stage lock mechanism in a scanning electron microscope in accordance with the present invention.

FIG. 16 shows a fourth embodiment of a stage lock mechanism in a scanning electron microscope in accordance with the present invention. An x table 159, a y table 160 and a rotation table 161 are mounted on a tilt table 158. A sample 162 is bonded on a sample holder 164 inserted into a holder table 163 attached to the rotation table, and the sample 162 is moved in the x- and y-directions and rotated. The tilt table 158 is rotatably attached to a z table 166 through a tilt shaft 165, and the sample 162 may be moved in the z-direction and also rotated. The driving system moving in the x-, y- or z-direction or rotating or tilting each of the tables is the same as that in the conventional scanning electron microscope. A lock plate 167 is fixed to an end portion of the tilt table 158 and is pushed by a lock shaft 170 of the lock mechanism 169 attached to a sample chamber 168 pushes, and a lock shaft 173 of the lock mechanism 172 attached to a stage case 171 pushes a vertical portion 158a of the tilt table 158 to a direction opposite to the lock shaft 170 of the lock mechanisms 169 to suppress vibration caused by floor vibration or sound.

According to the present embodiment, vibration of the tilt table 158 in the x-direction can be effectively suppressed and reliability of the tilt mechanism can be improved because the tilt table 158 is pushed by the lock shafts 170, 173 from the both sides in the x-direction. Further, in regard to vibration of the tilt table 158 in the y- and z-directions, the vibration of the tilt table 158 in the y- and z-directions can be effectively suppressed because friction forces can be applied to two positions between the lock shaft 173 and the vertical portion 158a of the tilt table 158 and between the lock shaft 170 and the lock plate 167. As a result, the relative displacement between the electron beam and the sample becomes smaller, and the SEM image fault caused by floor vibration or sound vibration is substantially reduced, and accordingly the resolution of the scanning electron microscope can be substantially improved. The present embodiment is suitable for a scanning electron microscope used in an environment where vibration of floor or vibration of sound is large and required high resolution.

In the above-mentioned embodiments of the present invention, the configuration of the sample movement stage is that the tilt table is set on the z table, and the x table, the y table and the rotation table are mounted on the tilt table, as in the conventional example. However, the same effect can be obtained by a case where the x table and the y table are mounted on the tilt table, or a case where the x table, the y table and the rotation table are mounted on the tilt table. Further, in regard to driving each of the tables in the above-mentioned embodiments, the z table is moved in the z-direction by the action of screw provided in the knob attached to the stage case by rotating the knob, the tilt table is tilted by rotating the knob to rotate the tilt shaft through the worm gear and the worm wheel, the x and y tables are respectively driven by the DC motors attached the stage case through the stage joints, the ball screws and the ball screw nuts, and the rotation table is rotated by rotating the knob through the worm gear and the worm wheel. However, the same effect can be obtained by a configuration that the rotation table, the z table and the tilt table are also driven by DC motors, or a configuration that the x table, the y table and the rotation table are driven by DC motors arranged in the sample chamber, or a configuration that these combination are changed.

As having been described above, according to the embodiments of the present invention, the vibration-proof capability of the sample stage can be improved to protect the sample from vibration, and consequently the SEM image fault caused by the vibration can be prevented to improve the resolution.

What is claimed is:

1. A scanning electron microscope comprising:
   (1) a sample movement device for moving a sample, the sample movement device having.
      (1-1) a first table for moving the sample in a first direction,
      (1-2) a second table for moving the sample in a second direction perpendicular to the first direction,
      (1-3) a tilting table for supporting said first and second tables, said tilting table supported on a rotating shaft so as to afford a tilting operation to the sample;
   (2) an electron gun generating an electron beam, an axis of the electron beam being perpendicular to the first and second directions;
   (3) means for scanning the sample with the electron beam to generate a signal characteristic of the sample and detecting the generated signal;

(4) a lock mechanism for locking said tilting table in a direction of the axis of the electron beam and in said first and second directions in a vibration-proof manner; and the lock mechanism is so constructed that the tilting table is pushed from the opposite direction of the electron beam to the rotating shaft for the tilting table using an oil hydraulic cylinder or a rotary pneumatic cylinder.

2. A scanning electron microscope comprising:

(1) a sample chamber for housing a sample;

(2) a sample movement device for moving the sample, said sample movement device having (2-1) a first table for moving the sample in a first direction, (2-2) a second table for moving the sample in a second direction perpendicular to the first direction, (2-3) a third table for moving the sample in a third direction perpendicular to the first and second directions, (2-4) a rotation table for rotating the sample, said rotation table supported on a rotating shaft (2-5) a tilting table for supporting said first, second and third tables, said tilting table supported on a rotating shaft so as to afford tilting operation to the sample;

(3) an electron gun generating an electron beam, an axis of the electron beam agreeing with the third direction;

(4) means for scanning the sample with the electron beam to generate a signal characteristic of the sample and detecting the generated signal;

(5) a lock mechanism for locking said tilting table in said first, second and third directions in a vibration-proof manner; and the lock mechanism is so constructed that the tilting table is pushed from the opposite direction of the electron beam to the rotating shaft for the tilting table using an oil hydraulic cylinder or a rotary pneumatic cylinder.

3. A scanning electron microscope according to claim 2, wherein said tilting table is attached to said third table so as to be moved together with said third table, said first table being attached to said tilting table so as to be moved together with said tilting table, said second table being attached to said first table so as to be moved together with said first table, and said rotation table being attached to said second table so as to be moved together with said second table.

4. A scanning electron microscope according to claim 3, wherein said lock mechanism comprises a reciprocal oil hydraulic cylinder and a lock shaft moved by a thrust of the reciprocal oil hydraulic cylinder, said tilting table being pushed by the lock shaft.

5. A scanning electron microscope according to claim 4, wherein said lock shaft comprises a member having a friction coefficient larger than a second friction coefficient of said lock shaft at its front end, and said tilting table is pushed by the member.

6. A scanning electron microscope according to claim 4, wherein an opposite end portion of said tilt table to an end portion on a side of an axis of a tilting operation afforded to the sample is included as a part of an area in which said lock mechanism pushes said tilt table.

7. A scanning electron microscope according to claim 3, which comprises a lock bearing attached to said sample chamber and a lock shaft engaged with the lock bearing, and said lock shaft pushes said tilting table by rotating said lock shaft.

8. A scanning electron microscope according to claim 7, which comprises means for rotating said lock shaft, said rotating means having a motor or a pneumatic rotary actuator.

9. A scanning electron microscope according to claim 2, wherein said lock mechanism pushes said tilt table from both sides in the first direction.

10. A scanning electron microscope comprising a sample movement stage having an x table for moving a sample in an x-direction, a y table for moving the sample in a y-direction perpendicular to the x-direction, and a tilting table, which supports the x table and the y table, for affording tilting operation to the sample, the sample being scanned with an electron beam having a z-axis perpendicular to the x-direction and the y-direction so as to detect a signal generated from the sample thereby and display an image of the sample, the scanning electron microscope further comprising a stage lock mechanism pushing the tilting table from the opposite direction of the electron beam to a rotating shaft for the tilting table in a longitudinal direction of the rotating shaft, the stage lock mechanism pushing the tilt table through a lock shaft using an oil hydraulic cylinder or a rotary pneumatic cylinder, and a contacting portion of the lock shaft with the tilting table being so formed as to have a contact plane larger than a diameter of the lock shaft.

11. A scanning electron microscope according to claim 10, wherein the contacting portion of the lock shaft with the tilting table comprises a member larger in a coefficient of friction than the lock shaft.

* * * * *